(12) United States Patent
Huang et al.

(10) Patent No.: US 11,128,291 B1
(45) Date of Patent: Sep. 21, 2021

(54) HIGH LINEARITY AND LOW VOLTAGE INPUT BUFFER CIRCUIT

(71) Applicant: CHENGDU HUAWEI ELECTRONIC TECHNOLOGY CO., LTD., Chengdu (CN)

(72) Inventors: Zhengbo Huang, Chengdu (CN); Yuanjun Cen, Chengdu (CN); Jinda Yang, Chengdu (CN); Qiang Yu, Chengdu (CN)

( * ) Notice: Subject to any disclaimer, the term of this patent is extended or adjusted under 35 U.S.C. 154(b) by 0 days.

(21) Appl. No.: 17/037,894

(22) Filed: Sep. 30, 2020

(51) Int. Cl.
| | |
|---|---|
| *H03K 3/00* | (2006.01) |
| *H03K 3/356* | (2006.01) |
| *H03K 3/3565* | (2006.01) |
| *H03F 3/45* | (2006.01) |
| *H03K 17/16* | (2006.01) |
| *H03K 3/012* | (2006.01) |

(52) U.S. Cl.
CPC ........... *H03K 17/162* (2013.01); *H03K 3/012* (2013.01)

(58) Field of Classification Search
None
See application file for complete search history.

(56) References Cited

U.S. PATENT DOCUMENTS

| | | | |
|---|---|---|---|
| 6,452,429 | B1 | 9/2002 | Lim |
| 7,694,243 | B2 * | 4/2010 | Camara ............ H03K 19/00315 716/106 |
| 2005/0046605 | A1 | 3/2005 | Ayyagari et al. |
| 2015/0102848 | A1 | 4/2015 | Chen et al. |

FOREIGN PATENT DOCUMENTS

| | | |
|---|---|---|
| CN | 102035535 A | 4/2011 |
| CN | 208190626 U | 12/2018 |

* cited by examiner

*Primary Examiner* — Kenneth B Wells

(57) ABSTRACT

Disclosed is a high-linearity low-voltage input buffer circuit. The buffer circuit includes main buffers of positive and negative input terminals comprised of NMOS transistor $M_{N1}$ and $M_{N3}$ as well as $M_{N2}$ and $M_{N6}$, auxiliary buffer comprised of PMOS transistors $M_{P1}$ and $M_{P3}$ as well as $M_{P2}$ and $M_{P4}$, replica current amplifier comprised of NMOS transistors $M_{N3}$ and $M_{N4}$ as well as $M_{N5}$ and $M_{N6}$. Two ends of a replica capacitor Cc are respectively connected with positive and negative output terminals of the auxiliary buffer. The auxiliary buffer is used to simulate a load effect of the main buffers to generate a replica current of a load current, then the replica current is mirrored to a load transistor of the main buffer by the current amplifier, and the load capacitor is charged and discharged through the load transistor.

8 Claims, 3 Drawing Sheets

HIGH LINEARITY AND LOW VOLTAGE INPUT BUFFER CIRCUIT

CROSS-REFERENCE TO RELATED APPLICATIONS

This application claims priority to Chinese Patent Application No. 202010589767.8 with a filing date of Jun. 24, 2020. The content of the aforementioned applications, including any intervening amendments thereto, are incorporated herein by reference.

TECHNICAL FIELD

The disclosure relates to the field of integrated circuit design, and more specifically, to a high-linearity low-voltage input buffer circuit, which is mainly used for isolating package parasitic parameters and kick-back noises of a sample-and-hold network when designing a high-speed high-precision analog-to-digital converter, and may also be used in other signal processing systems with high-linearity buffer requirements.

BACKGROUND

With the development of semiconductor technologies, a resolution and a sampling rate of an analog-to-digital converter (ADC) have developed rapidly, and influences of package parasitic parameters and kick-back noises of a sample-and-hold network on an input signal of the ADC is becoming more and more serious. A common method is to integrate an input buffer inside the ADC to isolate the input signal from the sample-and-hold circuit and reduce the load of the input signal. However, an input buffer is located at the forefront of the system input, and performances of the input buffer will determine an upper performance limit that the overall system can achieve. In a high-speed high-precision signal processing system, an analog signal buffer with low voltage, low power consumption and high performance is becoming more and more important.

The U.S. Pat. No. 8,339,161B2 of ADI (Analog Devices) of the United States discloses a technical solution for using a replica impedance to generate a replica current to compensate a load current, and a circuit structure thereof is shown in FIG. 1. In this structure, the replica impedance which is completely the same as the load impedance is connected at an input terminal to generate the replica current. By adding a cascode transistor in the buffer, the replica current is injected into the load through the cascode transistor, keeping the input transistor current constant and improving the linearity. The above circuit structure can effectively solve the problem of nonlinear transconductance of input transistors caused by the load current, but extra transistors are needed to limit the reduction of a power supply voltage.

Patent U.S. Pat. No. 9,628,099B2 of TI (Texas Instruments) of the United States discloses a technical solution of load current compensation for analog input buffers, and a circuit structure thereof is shown in FIG. 2 and FIG. 3. In this structure, a current opposite to a load CL is generated by a capacitor C1 and a negative input voltage Vinn, and then flows into a buffer load Q2 through a current mirror Q3, so that the current flowing through an input transistor Q1 is basically constant and a nonlinear influence caused by the load current is eliminated. The patent of TI uses current mirror amplification to compensate the load current image, which eliminates the problem that the patent of ADI above needs additional transistor. However, if the circuit structure shown in FIG. 2 is employed, the replica capacitor $C_1$ is directly connected to an input terminal, which will increase a load of the input terminal. If the circuit structure shown in FIG. 3 is employed, an auxiliary buffer will effectively reduce the input load, but an additional load current mirror subcircuit Ibias is needed, which will increase system power consumption.

In addition, a replica impedance and an output impedance of the patent of ADI above are exactly the same, which cannot reduce a input signal load, but also waste areas. The patent of TI above reduces the replica capacitor $C_1$ to N times of the load capacitor $C_L$ (n-bit current mirror amplification factor) through the current mirror amplification, but still needs a larger replica capacitor size.

SUMMARY

The technical problems to be solved by the disclosure are: to solve the problems in the prior art that an extra transistor needs to be introduced into a main buffer to limit the reduction of a power supply voltage, an input load cannot be effectively reduced or an extra main buffer load bias circuit $I_{Bias}$ needs to be introduced, and meanwhile, to further reduce a size of a compensation capacitor and effectively reduce a power consumption and an area.

In order to solve the above technical problems, the present disclosure provides a high-linearity low-voltage input buffer circuit with a positive input terminal $V_{IP}$ and a negative input terminal $V_{IN}$ being differential input. The buffer circuit includes a first main buffer comprised of $M_{N1}$ and $M_{N3}$ as a positive input terminal $V_{IP}$, a second main buffer comprised of $M_{N2}$ and $M_{N6}$ as a negative input terminal $V_{IN}$, an auxiliary buffer comprised of $M_{P1}$ and $M_{P3}$ as well as $M_{P2}$ and $M_{P4}$, a replica current amplifier comprised of $M_{N3}$ and $M_{N4}$ as well as $M_{N5}$ and $M_{N6}$ and a replica capacitor $C_c$. $M_{N1}$, $M_{N2}$, $M_{N3}$, $M_{N4}$, $M_{N5}$ and $M_{N6}$ are NMOS transistors, $M_{P1}$, $M_{P2}$, $M_{P3}$, and $M_{P4}$ are PMOS transistors.

A gate of $M_{N1}$ is connected with the positive input terminal $V_{IP}$, a drain of $M_{N1}$ is connected with a power supply $V_{DD}$, a source of $M_{N1}$ is connected with a drain of $M_{N3}$, and a source of $M_{N3}$ is grounded; a gate of $M_{N3}$ is connected with a gate of $M_{N4}$, and the gate of $M_{N4}$ is connected with a drain of $M_{N4}$ and connected to a drain of $M_{P3}$; a source of $M_{N4}$ is grounded; and a gate of $M_{P3}$ is connected with the positive input terminal $V_{IP}$, a source of $M_{P3}$ is connected with a drain of $M_{P1}$, a gate of $M_{P1}$ is connected with a bias voltage $V_B$, and a source of $M_{P1}$ is connected with the power supply $V_{DD}$.

A gate of $M_{N2}$ is connected with the negative input terminal $V_{IN}$, a drain of $M_{N2}$ is connected with the power supply $V_{DD}$, a source of $M_{N2}$ is connected with a drain of $M_{N6}$, and a source of $M_{N6}$ is grounded; a gate of $M_{N6}$ is connected with a gate of $M_{N5}$, and the gate of $M_{N5}$ is connected with a drain of $M_{N5}$ and connected to a drain of $M_{P4}$; a source of $M_{N5}$ is grounded; a gate of $M_{P4}$ is connected with the negative input terminal $V_{IN}$, a source of $M_{P4}$ is connected with a drain of $M_{P2}$, a gate of $M_{P2}$ is connected with the bias voltage $V_B$, and a source of $M_{P2}$ is connected with the power supply $V_{DD}$.

The source of $M_{N1}$ is connected with the drain of $M_{N3}$ and connected with a positive output terminal $V_{OUP}$. The source of $M_{N2}$ is connected with the drain of $M_{N6}$ and connected to a negative output terminal $V_{OUN}$. The source of $M_{P3}$ and the drain of $M_{P1}$ are connected to one end of the replica capacitor $C_c$, and the source of $M_{P4}$ and the drain of $M_{P2}$ are connected to the other end of the replica capacitor $C_c$.

In the foregoing solution, the positive output terminal $V_{OUP}$ and the negative output terminal $V_{OUN}$ of the low-voltage input buffer circuit are respectively connected with respective load capacitors $C_L$.

In the foregoing solution, an amplification factor of the replica current amplifiers respectively formed by $M_{N3}$ and $M_{N4}$ as well as $N_{N5}$ and $M_{N6}$ is N.

In the foregoing solution, a size of the replica capacitor $C_c$ is 1/(2N) times of the load capacitor $C_L$.

Moreover, the above technical problems can also be solved by dual replacement of PMOS and NMOS in the foregoing solutions. In the solution, $M_{P1}$ and $M_{P3}$ form a first main buffer of the positive input terminal $V_{IP}$, $M_{P2}$ and $M_{P6}$ form a second main buffer of the negative input terminal $V_{IN}$. $M_{N1}$ and $M_{N3}$ as well as $M_{N2}$ and $M_{N4}$ respectively form an auxiliary buffer, and $M_{P3}$ and $M_{P4}$ as well as $M_{P5}$ and $M_{P6}$ respectively form a replica current amplifier. $M_{N1}$, $M_{N2}$, $M_{N3}$ and $M_{N4}$ are NMOS transistors, $M_{P1}$, $M_{P2}$, $M_{P3}$, $M_{P4}$, $M_{P5}$ and $M_{P6}$ are PMOS transistors, and the low-voltage input buffer circuit further comprises a replica capacitor $C_c$;

a gate of $M_{P1}$ is connected with the positive input terminal $V_{IP}$, a drain of $M_{P1}$ is grounded, a source of $M_{P1}$ is connected with a drain of $M_{P3}$, and a source of $M_{P3}$ is connected with a power supply $V_{DD}$; a gate of $M_{P3}$ is connected with a gate of $M_{P4}$, and the gate of $M_{P4}$ is connected with a drain of $M_{P4}$ and connected to a drain of $M_{N3}$; a source of $M_{P4}$ is connected with the power supply $V_{DD}$; a gate of $M_{N3}$ is connected with the positive input terminal $V_{IP}$, a drain of $M_{N3}$ is connected with a drain of $M_{N1}$, a gate of $M_{N1}$ is connected with a bias voltage $V_B$, and a source of $M_{N1}$ is grounded; and a gate of $M_{P2}$ is connected with the negative input terminal $V_{IN}$, a drain of $M_{P2}$ is grounded, a source of $M_{P2}$ is connected with a drain of $M_{P6}$, and a source of $M_{P6}$ is connected with the power supply $V_{DD}$; a gate of $M_{P6}$ is connected with a gate of $M_{P5}$, and the gate of $M_{P5}$ is connected with a drain of $M_{P5}$ and connected to a drain of $M_{N4}$; a source of $M_{P5}$ is connected with the power supply $V_{DD}$; a gate of $M_{N4}$ is connected with the negative input terminal $V_{IN}$, a drain of $M_{N4}$ is connected with a drain of $M_{N2}$ a gate of $M_{N2}$ is connected with a bias voltage $V_B$, and a source of $M_{N2}$ is grounded;

wherein a connection point between the source of $M_{P1}$ and the drain of MP3 is a positive output terminal $V_{OUP}$, and a connection point between the source of $M_{P2}$ and the drain of $M_{P5}$ is a negative output terminal $V_{OUN}$; and the source of $M_{N3}$ and the drain of $M_{N1}$ are connected to one end of the replica capacitor $C_c$, and the source of $M_{N4}$ and the drain of $M_{N2}$ are connected to the other end of the replica capacitor $C_c$.

Compared with the prior art, the present disclosure has the following beneficial effects.

(1) The auxiliary buffers are used to simulate a load effect of the main buffer, the auxiliary buffers and the replica capacitor $C_c$ connected with output nodes of the two auxiliary buffers are used to generate the replica current $i_C$, and then the replica current is mirrored to a load transistor of the main buffer through the current amplifier to compensate charge and discharge currents (load current) of the load capacitor $C_L$, so that a current of an input transistor of the main buffer is constant, improving an overall linearity and eliminating the problem of introducing extra transistors in the main buffer in the prior art.

(2) The auxiliary buffers are used to effectively reduce the input load, and a load current mirror bias generating sub-circuit $I_{bias}$ of the main buffer is not needed to be introduced additionally. Compared with the prior art, the input load is reduced, and meanwhile, an overall power consumption of the system is reduced.

(3) Two ends of the load capacitor (replica capacitor) of the auxiliary buffer are respectively connected with positive and negative output terminals of the auxiliary buffer respectively, which can further reduce the size of the replica capacitor by a half and reduce a chip area and the power consumption.

DETAILED DESCRIPTION

The embodiments of the disclosure will be further described hereinafter in detail with reference to the drawings.

Figure 1:
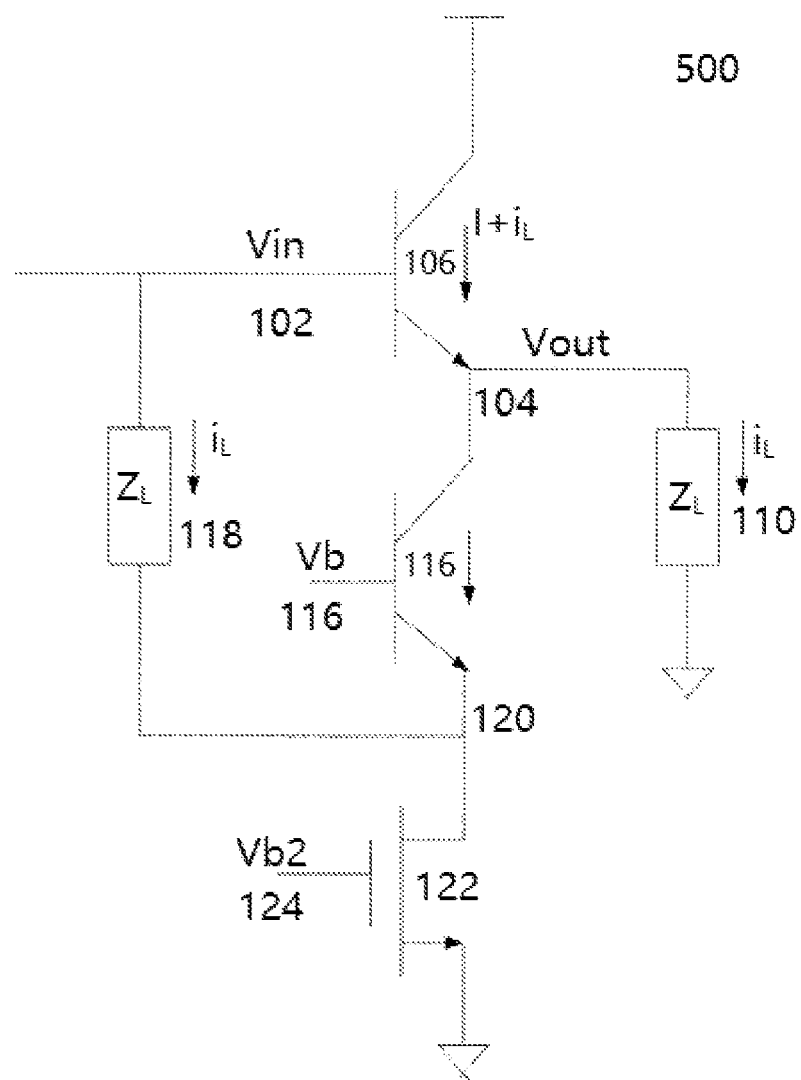
FIG. 1 illustrates a structure of an input buffer using a replica impedance to generate a replica current to compensate a load current in the prior art.
Figure 2:
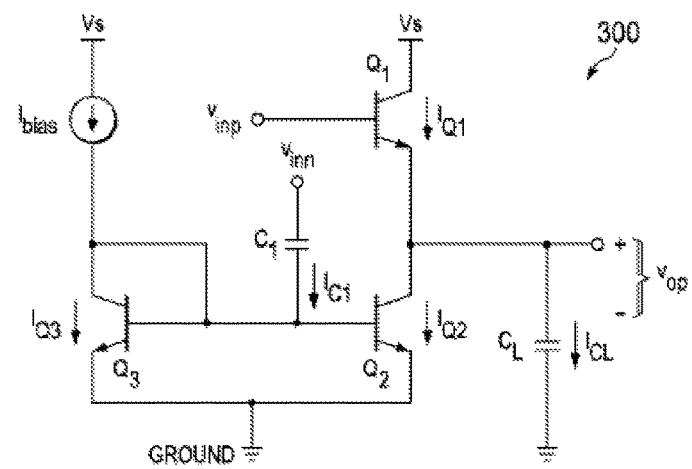
FIG. 2 illustrates a first structure of an input buffer employing load current compensation in the prior art.
Figure 3:
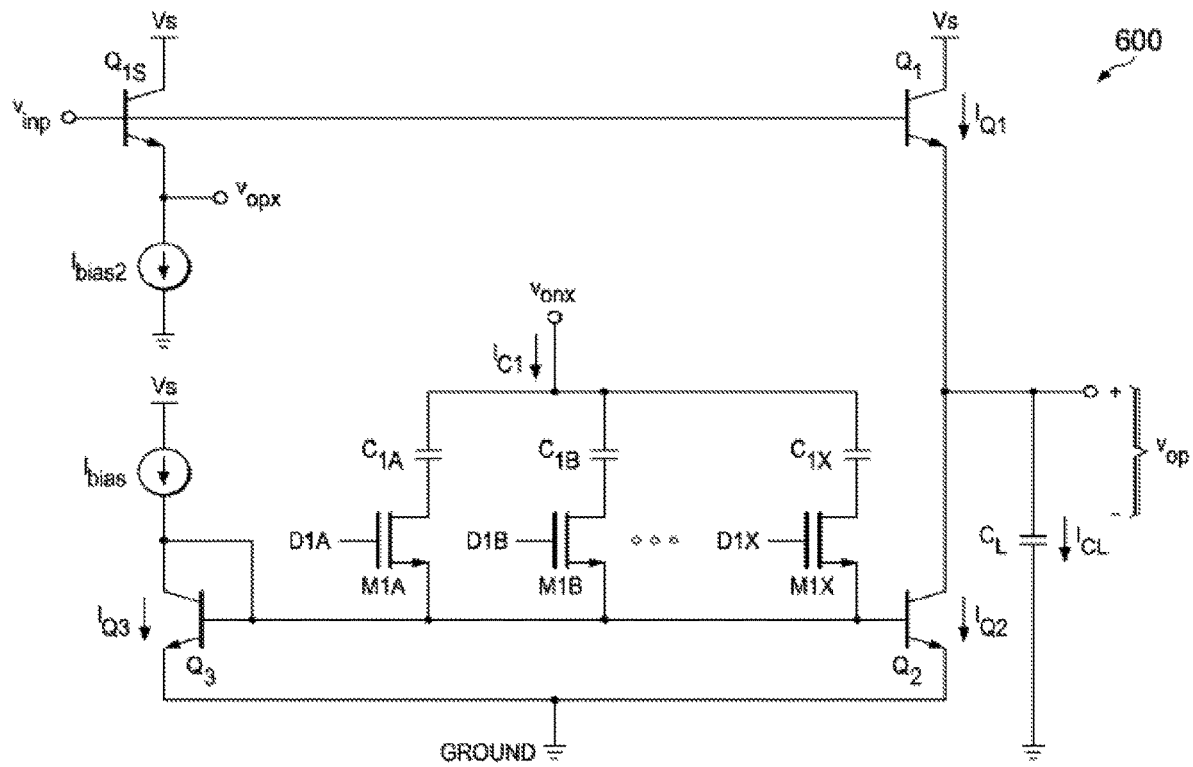
FIG. 3 illustrates a second structure of the input buffer employing load current compensation in the prior art.
Figure 4:
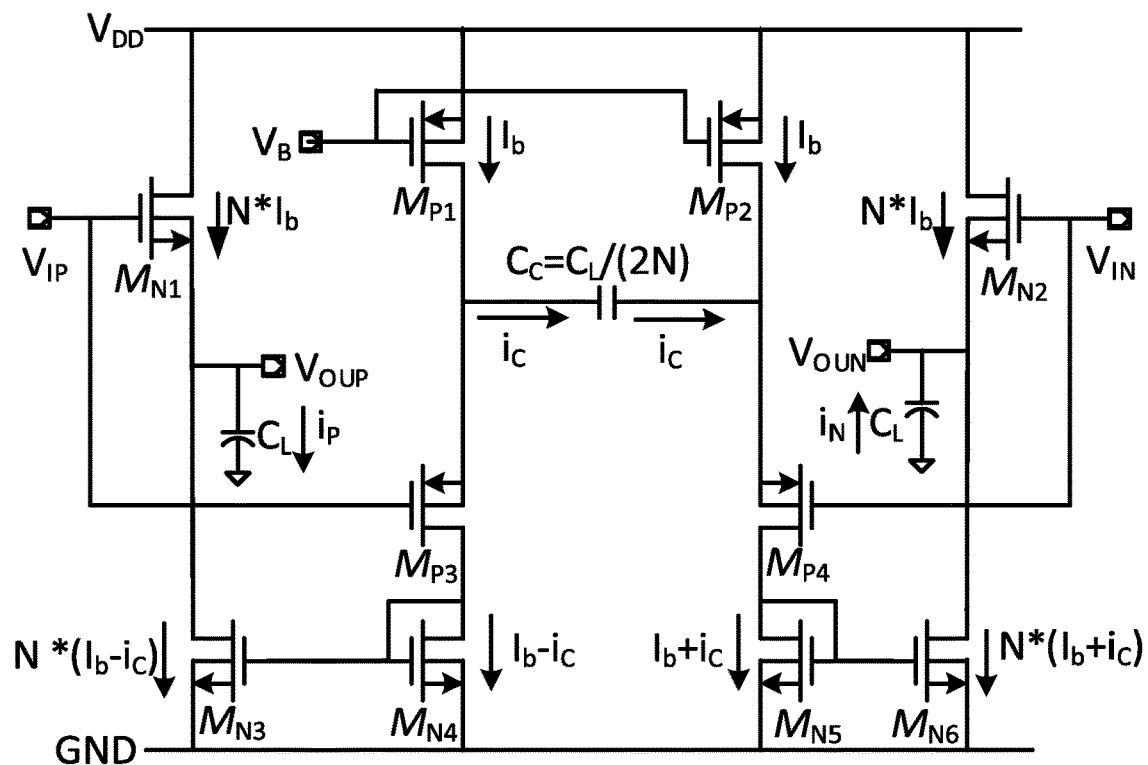
FIG. 4 illustrates a structure of a circuit of a high-linearity low-voltage input buffer according to an embodiment of the present disclosure.

In an embodiment, a structure of a high-linearity low-voltage input buffer circuit provided by the present disclosure is shown in FIG. 4. Differential input is employed between a positive input terminal $V_{IP}$ and a negative input terminal $V_{IN}$, $M_{N1}$ and $M_{N3}$ form a main buffer of the positive input terminal $V_{IP}$, $M_{N2}$ and $M_{N6}$ form a main buffer of the negative input terminal $V_{IN}$, $M_{P1}$ and $M_{P3}$ as well as $M_{P2}$ and $M_{P4}$ respectively form auxiliary buffers, and $M_{N3}$ and $M_{N4}$ as well as $M_{N5}$ and $M_{N6}$ respectively form replica current amplifiers; wherein $M_{N1}$, $M_{N2}$, $M_{N3}$, $M_{N4}$, $M_{N5}$ and $M_{N6}$ are NMOS transistors, $M_{P1}$, $M_{P2}$, $M_{P3}$ and $M_{P4}$ are PMOS transistors, and the low-voltage input buffer circuit further comprises a replica capacitor $C_c$ A connecting relationship of each element is as follows.

A gate of $M_{N1}$ is connected with the positive input terminal $V_{IP}$, a drain of $M_{N1}$ is connected with a power supply $V_{DD}$, a source of MINI is connected with a drain of $M_{N3}$, and a source of $M_{N3}$ is grounded; a gate of $M_{N3}$ is connected with a gate of $M_{N4}$, and the gate of $M_{N4}$ is connected with a drain of $M_{N4}$ and connected to a drain of $M_{P3}$; a source of $M_{N4}$ is grounded; and a gate of $M_{P3}$ is connected with the positive input terminal $V_{IP}$, a source of $M_{P3}$ is connected with a drain of $M_{P1}$, a gate of $M_{P1}$ is connected with a bias voltage $V_B$, and a source of $M_{P1}$ is connected with the power supply $V_{DD}$; and A gate of $M_{N2}$ is connected with the negative input terminal $V_{IN}$, a drain of $M_{N2}$ is connected with the power supply $V_{DD}$, a source of $M_{N2}$ is connected with a drain of $M_{N6}$, and a source of $M_{N6}$ is grounded; a gate of $M_{N6}$ is connected with a gate of $M_{N5}$, and the gate of $M_{N5}$ is connected with a drain of $M_{N5}$ and connected to a drain of $M_{P4}$; a source of $M_{N5}$ is grounded; a gate of $M_{P4}$ is connected with the negative input terminal $V_{IN}$, a source of $M_{P4}$ is connected with a drain of $M_{P2}$, a gate of $M_{P2}$ is connected with the bias voltage $V_B$, and a source of $M_{P2}$ is connected with the power supply $V_{DD}$;

A connection point between the source of $M_{N1}$ and the drain of $M_{N3}$ is a positive output terminal VOLT, and a connection point between the source of $M_{N2}$ and the drain of $M_{N6}$ is a negative output terminal $V_{OUN}$; and the source of $M_{P3}$ and the drain of $M_{P1}$ are connected to one end of the replica capacitor $C_c$, and the source of $M_{P4}$ and the drain of $M_{P2}$ are connected to the other end of the replica capacitor $C_c$.

In the present disclosure, fully-differential input signals are employed. Input signals of the positive input terminal VII, and the negative input terminal $V_{IN}$ are respectively acted on up-plates of respective load capacitors $C_L$ to generate load currents $i_P$ and $i_N$:

$$i_P = V_{IP} C_L s$$

$$i_N = V_{IN} C_L s.$$

The input signals of the positive input terminal $V_{IP}$ and the negative input terminal $V_{IN}$ are acted on two ends of the replica capacitor $C_C$ through the auxiliary buffers to generate a replica current $i_C$:

$$i_C = (V_{IP} - V_{IN}) C_C s.$$

The replica current $i_C$ flows through the transistors $M_{N4}$ and $M_{N5}$, and then the replica current $i_C$ is amplified by N times through mirror amplifiers formed by $M_{N3}$ and $M_{N4}$ as well as $M_{N5}$ and $M_{N6}$, and acted on the load capacitor $C_L$; when the replica capacitor $C_C$ and the load capacitor $C_L$ satisfy a relationship:

$$C_C = \frac{C_L}{2N*}$$

A small signal current flowing through the load transistors $M_{N3}$ and $M_{N6}$ of the main buffer will have the same amplitude and opposite phase as the load currents $i_P$ and $i_N$, thus ensuring that the current flowing through the input transistor of the main buffer is not affected by the load current, and improving the linearity.

Figure 5:
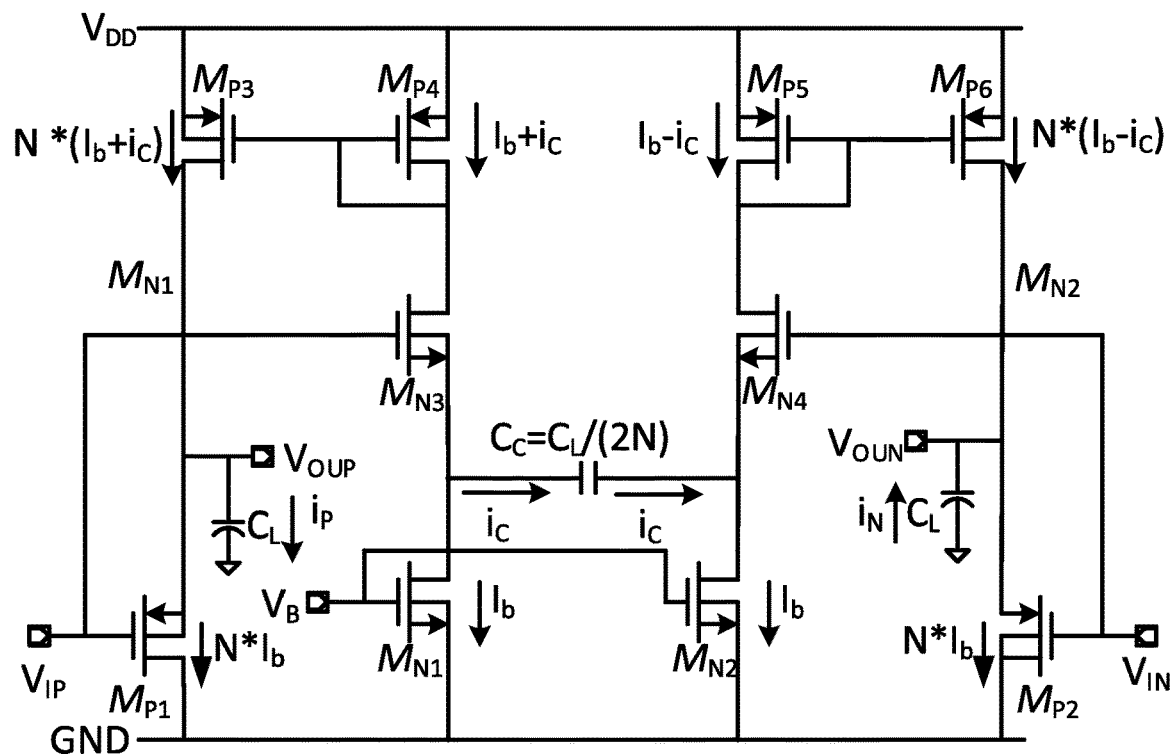
FIG. 5 illustrates a structure of a circuit of a high-linearity low-voltage input buffer according to another embodiment of the present disclosure.

In another embodiment provided by the present disclosure, i.e., dual replacement is performed on PMOS and NMOS in the first solution. A structure of a high-linearity low-voltage input buffer circuit provided by the embodiment is shown in FIG. 5. $M_{P1}$ and $M_{P3}$ form a main buffer of the positive input terminal $V_{IP}$, $M_{P2}$ and $M_{P6}$ form a main buffer of the negative input terminal $V_{IN}$, $M_{N1}$ and $M_{N3}$ as well as $M_{N2}$ and $M_{N4}$ respectively form auxiliary buffers, and $M_{P3}$ and $M_{P4}$ as well as $M_{P5}$ and $M_{P6}$ respectively form replica current amplifiers; wherein $M_{N1}$, $M_{N2}$, $M_{N3}$ and $M_{N4}$ are NMOS transistors, $M_{P1}$, $M_{P2}$, MP3, $M_{P4}$, $M_{P5}$ and $M_{P6}$ are PMOS transistors, and the low-voltage input buffer circuit further comprises a replica capacitor $C_c$; wherein a connecting relationship of each element is as follows:

A gate of $M_{P1}$ is connected with the positive input terminal Yip, a drain of $M_{P1}$ is grounded, a source of $M_{P1}$ is connected with a drain of $M_{P3}$, and a source of $M_{P3}$ is connected with a power supply $V_{DD}$; a gate of $M_{P3}$ is connected with a gate of $M_{P4}$, and the gate of $M_{P4}$ is connected with a drain of $M_{P4}$ and connected to a drain of $M_{N3}$; a source of $M_{P4}$ is connected with the power supply $V_{DD}$; a gate of $M_{N3}$ is connected with the positive input terminal $V_{IP}$, a drain of $M_{N3}$ is connected with a drain of $M_{N1}$, a gate of $M_{N1}$ is connected with a bias voltage $V_B$, and a source of $M_{N1}$ is grounded.

A gate of $M_{P2}$ is connected with the negative input terminal $V_{IN}$, a drain of $M_{P2}$ is grounded, a source of $M_{P2}$ is connected with a drain of $M_{P6}$, and a source of $M_{P6}$ is connected with the power supply $V_{DD}$; a gate of $M_{P6}$ is connected with a gate of $M_{P5}$, and the gate of $M_{P5}$ is connected with a drain of $M_{P5}$ and connected to a drain of $M_{N4}$; a source of $M_{P5}$ is connected with the power supply $V_{DD}$; a gate of $M_{N4}$ is connected with the negative input terminal $V_{IN}$, a drain of $M_{N4}$ is connected with a drain of $M_{N2}$ a gate of $M_{N2}$ is connected with a bias voltage $V_B$, and a source of $M_{N2}$ is grounded.

A connection point between the source of $M_{P1}$ and the drain of $M_{P3}$ is a positive output terminal $V_{OUP}$, and a connection point between the source of $M_{P2}$ and the drain of $M_{P6}$ is a negative output terminal $V_{OUN}$; and the source of $M_{N3}$ and the drain of $M_{N1}$ are connected to one end of the replica capacitor $C_c$, and the source of $M_{N4}$ and the drain of $M_{N2}$ are connected to the other end of the replica capacitor $C_c$.

A working principle of this embodiment is the same as that of the first embodiment. Input signals of the positive input terminal $V_{IP}$ and the negative input terminal $V_{IN}$ are respectively acted on up-plates of respective load capacitors $C_L$ to generate load currents $i_P$ and $i_N$; moreover, the input signals of the positive input terminal $V_{IP}$ and the negative input terminal $V_{IN}$ are acted on two ends of the replica capacitor $C_C$ through the auxiliary buffers to generate a replica current $i_C$. The replica current $i_C$ flows through the transistors $M_{P4}$ and $M_{P5}$, and then the replica current $i_C$ is amplified by N times through mirror amplifiers formed by $M_{P3}$ and $M_{P4}$ as well as $M_{P5}$ and $M_{P6}$, and acted on the load capacitor $C_L$; when the replica capacitor $C_C$ and the load capacitor $C_L$ satisfy a relationship:

$$C_C = \frac{C_L}{2N*}$$

a small signal current flowing through the load transistors MP3 and $M_{P6}$ of the main buffer will have the same amplitude and opposite phase as the load currents $i_P$ and $i_N$, thus ensuring that the current flowing through the input transistor of the main buffer is not affected by the load current, and improving the linearity.

The disclosure may also be realized by other embodiments. For example, the input transistors $M_{P3}$ or $M_{P4}$ of the auxiliary buffers in the first embodiment may be replaced by NMOS transistors, and the same objective may be achieved by adjusting the replica capacitor $C_C$. At this time, the auxiliary buffer is converted into an amplifier, and the replica capacitor $C_C$ is reduced proportionally according to an amplification factor of the amplifier, which can also achieve the objective of the disclosure.

The above are only preferred embodiments of the disclosure, and are not intended to limit the disclosure. Any modification, equivalent substitution and improvement made within the ideological principle of the disclosure shall be included in the protection scope of the disclosure.

What is claimed is:

1. A high-linearity low-voltage input buffer circuit with a positive input terminal $V_{IP}$ and a negative input terminal $V_{IN}$ being differential input, comprising:

a first main buffer comprising $M_{N1}$ and $M_{N3}$ connected to the positive input terminal $V_{IP}$, a second main buffer comprising $M_{N2}$ and $M_{N6}$ connected to the negative input terminal $V_{IN}$, an auxiliary buffer comprising $M_{P1}$ and $M_{P3}$ as well as $M_{P2}$ and $M_{P4}$, and a replica current amplifier comprising $M_{N3}$ and $M_{N4}$ as well as $M_{N5}$ and $M_{N6}$ and a replica capacitor $C_c$;

wherein $M_{N1}$, $M_{N2}$, $M_{N3}$, $M_{N4}$, $M_{N5}$ and $M_{N6}$ are NMOS transistors, and $M_{P1}$, $M_{P2}$, $M_{P3}$ and $M_{P4}$ are PMOS transistors;

a gate of the $M_{N1}$ is connected with the positive input terminal $V_{IP}$, a drain of the $M_{N1}$ is connected with a power supply $V_{DD}$ and a source of the $M_{N1}$ is connected with a drain of $M_{N3}$; a source of $M_{N3}$ is grounded and a gate of $M_{N3}$ is connected with a gate of $M_{N4}$, a gate of $M_{N4}$ is connected with a drain of $M_{N4}$ and connected to a drain of $M_{P3}$; a source of $M_{N4}$ is grounded; a gate of $M_{P3}$ is connected with the positive input terminal $V_{IP}$ and a source of $M_{P3}$ is connected with a drain of $M_{P1}$, a gate of $M_{P1}$ is connected with a bias voltage $V_B$, and a source of $M_{P1}$ is connected with the power supply $V_{DD}$;

a gate of $M_{N2}$ is connected with the negative input terminal $V_{IN}$, a drain of $M_{N2}$ is connected with the power supply $V_{DD}$ and a source of $M_{N2}$ is connected with a drain of $M_{N6}$, a source of $M_{N6}$ is grounded and a gate of $M_{N6}$ is connected with a gate of $M_{N5}$, a gate of $M_{N5}$ is connected with a drain of $M_{N5}$ and connected to a drain of $M_{P4}$ and a source of $M_{N5}$ is grounded; a gate of $M_{P4}$ is connected with the negative input terminal $V_{IN}$, a source of $M_{P4}$ is connected with a drain of $M_{P2}$; a gate of $M_{P2}$ is connected with the bias voltage $V_B$, and a source of $M_{P2}$ is connected with the power supply $V_{DD}$; and the source of $M_{N1}$ is connected with the drain of $M_{N3}$ and connected to a positive output terminal $V_{OUP}$; the source of $M_{N2}$ is connected with the drain of $M_{N6}$ and connected to a negative output terminal $V_{OUN}$; the source of $M_{P3}$ and the drain of $M_{P1}$ are connected to one end of the replica capacitor $C_c$, and the source of $M_{P4}$ and the drain of $M_{P2}$ are connected to the other end of the replica capacitor $C_c$.

2. The low-voltage input buffer circuit of claim 1, wherein the positive output terminal VOUP and the negative output terminal VOUN are respectively connected with respective load capacitors CL.

3. The low-voltage input buffer circuit of claim 2, wherein an amplification factor of the replica current amplifier is N.

4. The low-voltage input buffer circuit of claim 3, wherein a size of the replica capacitor Cc is 1/(2N) times the load capacitor CL.

5. A high-linearity low-voltage input buffer circuit with a positive input terminal $V_{IP}$ and a negative input terminal $V_{IN}$ being differential input, comprising:

a first main buffer comprising $M_{P1}$ and $M_{P3}$ connected to a positive input terminal $V_{IP}$, a second main buffer comprising $M_{P2}$ and $M_{P6}$ connected to a negative input terminal $V_{IN}$; an auxiliary buffer comprising $M_{N1}$ and $M_{N3}$ as well as $M_{N2}$ and $M_{N4}$, a replica current amplifier comprising $M_{P3}$ and $M_{P4}$ as well as $M_{P5}$ and $M_{P6}$ and a replica capacitor $C_c$;

wherein $M_{N1}$, $M_{N2}$, $M_{N3}$ and $M_{N4}$ are NMOS transistors, and $M_{P1}$, $M_{P2}$, $M_{P3}$, $M_{P4}$, $M_{P5}$ and $M_{P6}$ are PMOS transistors;

a gate of $M_{P1}$ is connected with the positive input terminal $V_{IP}$, a drain of $M_{P1}$ is grounded, and a source of $M_{P1}$ is connected with a drain of $M_{P3}$; a source of $M_{P3}$ is connected with a power supply $V_{DD}$ and a gate of $M_{P3}$ is connected with a gate of $M_{P4}$; a gate of $M_{P4}$ is connected with a drain of $M_{P4}$ and connected to a drain of $M_{N3}$ and a source of $M_{P4}$ is connected with the power supply $V_{DD}$; a gate of $M_{N3}$ is connected with the positive input terminal $V_{IP}$, a drain of $M_{N3}$ is connected with a drain of $M_{N1}$, a gate of $M_{N1}$ is connected with a bias voltage $V_B$, and a source of $M_{N1}$ is grounded;

a gate of $M_{P2}$ is connected with the negative input terminal $V_{IN}$, a drain of $M_{P2}$ is grounded, a source of $M_{P2}$ is connected with a drain of $M_{P6}$, a source of $M_{P6}$ is connected with the power supply $V_{DD}$ and a gate of $M_{P6}$ is connected with a gate of $M_{P5}$, a gate of $M_{P5}$ is connected with a drain of $M_{P5}$ and connected to a drain of $M_{N4}$ and a source of $M_{P5}$ is connected with the power supply $V_{DD}$; a gate of $M_{N4}$ is connected with the negative input terminal $V_{IN}$ and a drain of $M_{N4}$ is connected with a drain of $M_{N2}$; a gate of $M_{N2}$ is connected with a bias voltage $V_B$, and a source of $M_{N2}$ is grounded; and the source of $M_{P1}$ is connected with the drain of $M_{P3}$ and connected to a positive output terminal $V_{OUP}$; the source of $M_{P2}$ is connected with the drain of $M_{P6}$ and connected to a negative output terminal $V_{OUN}$; the source of $M_{N3}$ and the drain of $M_{N1}$ are connected to one end of the replica capacitor $C_c$, and the source of $M_{N4}$ and the drain of $M_{N2}$ are connected to the other end of the replica capacitor $C_c$.

6. The low-voltage input buffer circuit of claim 5, wherein the positive output terminal VOUP and the negative output terminal VOUN are respectively connected with respective load capacitors CL.

7. The low-voltage input buffer circuit of claim 6, wherein an amplification factor of the replica current amplifier is N.

8. The low-voltage input buffer circuit of claim 7, wherein a size of the replica capacitor Cc is 1/(2N) times the load capacitor CL.

* * * * *